(12) United States Patent
Tong et al.

(10) Patent No.: US 12,431,327 B2
(45) Date of Patent: Sep. 30, 2025

(54) STROBOSCOPIC ELECTRON-BEAM SIGNAL IMAGE MAPPING

(71) Applicant: Intel Corporation, Santa Clara, CA (US)

(72) Inventors: Xianghong Tong, Hillsboro, OR (US); Martin Von Haartman, Portland, OR (US); Wen-Hsien Chuang, Portland, OR (US); Zhiyong Ma, Hillsboro, OR (US); Hyuk Ju Ryu, Hillsboro, OR (US); Prasoon Joshi, Hillsboro, OR (US); May Ling Oh, Portland, OR (US); Jennifer Huening, Hillsboro, OR (US); Shuai Zhao, Beaverton, OR (US); Charles Peterson, Hillsboro, OR (US); Ira Jewell, Hillsboro, OR (US); Hasan Faraby, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 581 days.

(21) Appl. No.: 17/711,785

(22) Filed: Apr. 1, 2022

(65) Prior Publication Data
US 2023/0317408 A1    Oct. 5, 2023

(51) Int. Cl.
*H01J 37/26* (2006.01)
*H01J 37/244* (2006.01)
*H01J 37/28* (2006.01)

(52) U.S. Cl.
CPC .......... *H01J 37/265* (2013.01); *H01J 37/244* (2013.01); *H01J 37/28* (2013.01); *H01J 2237/221* (2013.01); *H01J 2237/2443* (2013.01); *H01J 2237/2801* (2013.01); *H01J 2237/2814* (2013.01)

(58) Field of Classification Search
CPC ........ H01J 37/265; H01J 37/244; H01J 37/28; H01J 2237/221; H01J 2237/2443; H01J 2237/2801; H01J 2237/2814; H01J 2237/0432; H01J 37/045
See application file for complete search history.

(56) References Cited

U.S. PATENT DOCUMENTS 2,839,706 A * 6/1958 Anderson ............... H01J 49/30
 250/426
2,920,271 A * 1/1960 Bryden ................... G01R 27/28
 324/622

(Continued)

FOREIGN PATENT DOCUMENTS

WO    2019066802    4/2019

*Primary Examiner* — David A Vanore
(74) *Attorney, Agent, or Firm* — Essential Patents Group, LLP

(57) ABSTRACT

Pulsed beam prober systems, devices, and techniques are described herein related to providing a beam detection frequency that is less than a electrical test frequency. An electrical test signal at the electrical test frequency is provided to die under test. A pulsed beam is applied to the die such that the pulsed beam has packets of beam pulses or a frequency delta with respect to the electrical test frequency. The packets of beam pulses or the frequency delta elicits a detectable beam modulation in an imaging signal reflected from the die such that the imaging signal is modulated at a detection frequency less than the electrical test frequency.

22 Claims, 10 Drawing Sheets

(56) References Cited

U.S. PATENT DOCUMENTS

| | | | | |
|---|---|---|---|---|
| 5,260,648 A * | 11/1993 | Brust | G01R 23/16 | 250/311 |
| 5,637,879 A * | 6/1997 | Schueler | H01J 37/3007 | 850/1 |
| 6,854,103 B2 * | 2/2005 | Teene | G06F 30/367 | 713/401 |
| 6,895,344 B2 * | 5/2005 | Ramaswamy | G06F 30/398 | 702/57 |
| 6,986,113 B2 * | 1/2006 | Sinha | G06F 30/367 | 716/120 |
| 7,096,451 B2 * | 8/2006 | Donaldson | G06F 30/39 | 174/255 |
| 7,203,629 B2 * | 4/2007 | Ozis | G06F 30/367 | 703/2 |
| 7,244,952 B2 * | 7/2007 | Mous | H01J 27/022 | 250/397 |
| 7,313,779 B1 * | 12/2007 | Masleid | G06F 30/327 | 716/120 |
| 7,483,818 B2 * | 1/2009 | Amakai | G06F 30/23 | 700/121 |
| 7,557,511 B2 * | 7/2009 | Strikovski | H01J 37/32009 | 427/535 |
| 7,774,174 B2 * | 8/2010 | Sheehan | G06F 30/367 | 703/2 |
| 7,818,158 B2 * | 10/2010 | McDonald | G06F 30/3323 | 703/3 |
| 8,099,699 B2 * | 1/2012 | Charlet | G06F 30/367 | 716/108 |
| 8,165,861 B2 * | 4/2012 | Guedon | G06F 30/367 | 703/13 |
| 8,478,553 B2 * | 7/2013 | Charlet | G06F 30/36 | 702/65 |
| 8,910,101 B1 * | 12/2014 | Yeh | G06F 30/367 | 716/113 |
| 9,405,873 B2 * | 8/2016 | Kanamoto | G06F 30/367 | |
| 9,633,149 B2 * | 4/2017 | Yen | G06F 30/367 | |
| 10,847,340 B2 * | 11/2020 | Papeer | G21K 1/093 | |
| 12,261,013 B2 * | 3/2025 | Kaneko | H01J 37/20 | |
| 2001/0029601 A1 * | 10/2001 | Kimura | G06F 30/367 | 716/55 |
| 2008/0285040 A1 * | 11/2008 | Fourkas | G01N 21/554 | 324/702 |
| 2011/0080093 A1 * | 4/2011 | Walton | H01J 3/025 | 315/111.21 |
| 2023/0343554 A1 * | 10/2023 | Chen | H01J 37/32165 | |
| 2025/0081324 A1 * | 3/2025 | Vekselman | H05H 9/02 | |

\* cited by examiner

STROBOSCOPIC ELECTRON-BEAM SIGNAL IMAGE MAPPING

BACKGROUND

Fault isolation and failure analysis are critical parts of integrated circuit product design validation and debug, process development, production yield improvement, reliability testing, product certification, and product reliability qualification. The ability to identify and isolate failing circuits and devices often defines the success or failure of a product launch. Current fault isolation may be achieved by packaging units post end of line, processing and sort testing, and subsequent use of optical tools such as laser assisted device alternation, thermal induced voltage alteration, and laser voltage probe/laser timing probe to locate failing devices or circuits.

The resolution of the optical approach is limited by optical system resolution in the infrared range where silicon is transparent, as the signal needs to go through the silicon to reach the devices or come from the device to reach the imaging system. Current resolution is limited to about 240 nm using a 3.0 numerical aperture solid immersion lens. Such optical tools will not be capable of resolving ever smaller features and, even when features are resolvable, problems related to missing signals that are critical for debug and fault isolation are evident. Furthermore, as advanced structure such as back-side power delivery become more widespread, optical tools are no longer plausible because of the blockage of signals from both side of the devices (i.e., with metallization on both the front- and back-side). In addition to such limitations with resolution, other difficulties persist.

It is with respect to these and other considerations that the present improvements have been needed.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
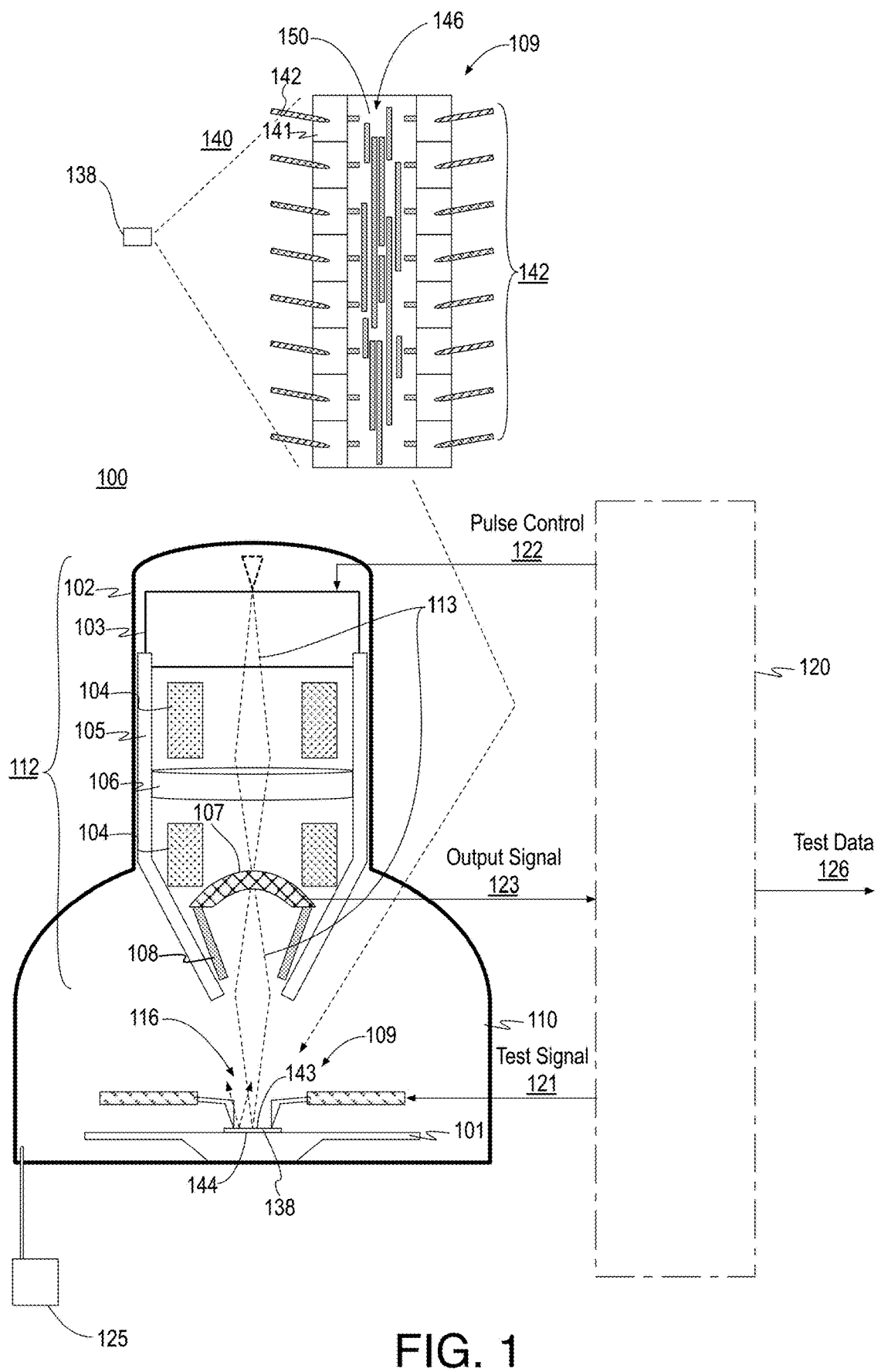
FIG. 1 is an illustration of an example electron-beam prober for performing stroboscopic electron beam signal image mapping.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the terms "monolithic", "monolithically integrated", and similar terms indicate the components of the monolithic overall structure form an indivisible whole not reasonably capable of being separated.

Stroboscopic electron beam prober techniques, devices, and systems are described herein related to using synchronized high frequency pulsing of an electron beam to perform stroboscopic sampling of on integrated circuit structures of a device under test.

As discussed, identifying and isolating failing circuits and devices is an important aspect of integrated circuit production, with improvements in such fault detection providing the ability to quickly launch new products, adjust process parameters for existing product lines, detect failing equipment, and so on. The techniques discussed herein improve testing resolution and quality by performing stroboscopic sampling of a device under a test.

For context, current optical test approaches are limited by the optical system resolution in the infrared range where silicon is transparent (e.g., since the signal needs to go through the silicon to reach the devices or come from the device to reach the imaging system) to a resolution of about 240 nm using 3.0 N.A. solid immersion lens. Such optical tools are not capable of resolving the small features of ever smaller integrated circuit features nor are they applicable in contexts where metallization is provided on both sides of a die. Electron beam (e-beam) testing provides better resolution in imaging, even though the beam modulation volume may typically be larger than the beam size due to the charging effect and electron scattering. Electron beam probing also has the advantage of being able to sense signals from both metal traces and semiconductors. It is therefore readily applicable to advanced structures in semiconductor devices such as when front- and back-side metallization is provided on a die.

The systems and techniques discussed herein apply pulsed e-beam probing from either the front-side or back-side (e.g., the silicon side) of a die, such that the probing is applied to devices, interconnects, thin dielectrics on top of a conductor through capacitive coupling, or the like. Such devices, interconnects, and similar structures are referred to as integrated circuit structures herein. In some embodiments, sample preparation may be performed prior to such e-beam probing such that the sample preparation exposes the integrated circuit structures, which are inclusive of semiconductor fins, semiconductor ribbons, semiconductor nanosheets, semiconductor nanowires, diffusion regions or materials, source/drain materials, metal interconnects, or others.

The discussed techniques may be referred to as stroboscopic electron-beam signal image mapping (SESIM) techniques. Such techniques provide visualization of electrical node response to the driving signal in the test pattern (e.g., an electrical test signal) thereby allowing quick and accurate localization of failing sites. Notably, prior electron-beam image mapping techniques are limited in that the highest detectable test signal frequency is limited by the maximum frequency bandwidth of the secondary electron detector, which is currently at or below about 15 MHz. It is desirable to deploy and detect test signal frequencies in much higher frequency ranges such as those up to 10 s of GHz, for example. The techniques discussed herein enable electron beam signal mapping of high frequency signals into the 10 s GHz range. In some embodiments, synchronized high frequency pulsing of the electron beam is used to perform stroboscopic sampling of the voltage potential on the electrical nodes on the device under test to enable high frequency signal mapping. As used herein, the term stroboscopic sampling indicates using a pulsed e-beam such that the pulses are timed to sample at predetermined time instances of the electrical test signal. The timed pulses are applied such that secondary electron beam detection can be performed at a much lower frequency (e.g., less that 15 MHz). Such techniques enable high speed (GHz) level electron-beam signal image mapping to be achieved by high-speed pulsing and pulse application to overcome low speed detector limitations. Furthermore, the discussed techniques enable extraction of phase and signal delay information that is not available using other techniques. Although discussed in large part herein with respect to e-beam applications, the discussed techniques may also be used in optical tools using a pulsed photon beam (i.e., a pulsed laser).

Such frequency expansion from the electrical test signal frequency (e.g., 10 s of GHz) to a frequency detectable by the secondary electron detector (e.g., below about 15 MHz) may be achieved using a wave packet technique or a frequency differential technique. In the wave packet technique, the frequency of the e-beam pulses matches or substantially matches the frequency of the electrical test signal. Furthermore, each e-beam pulse has a duration less than an on or off duration of the electrical test signal. For example, the e-beam pulse may be applied only when the electrical test signal is on or off. The high frequency e-beam pulses are then packetized or batched into packets of high frequency e-beam pulses. The packets are then deployed at a frequency (with durations of no pulses between the packets) capable of detection by the detector. For example, a first packet of multiple pulses (e.g., at the higher pulse frequency) is followed by a duration of no pulses. Then, a second packet of multiple pulses (e.g., again at the higher pulse frequency) follows the no pulse duration, the second packet of multiple pulses is followed by another duration of no pulses, and so on. The frequency of the repeated pattern of packets/durations of no pulses (e.g., a packet frequency) is provided at the desired frequency for detection at the detector. Thereby, an extremely high electrical test signal frequency is translated to a much lower detection frequency capable of being detected by the detector.

In the frequency differential technique, the frequency of the e-beam pulses (e.g., the pulse frequency) is offset with respect to the electrical test signal frequency by a frequency delta. The e-beam pulses then drift in phase along the modulated electrical test signal frequency such that certain ones of sequential e-beam pulses are applied in the off phase of the electrical test signal followed by others of sequential e-beam pulses being applied in the on phase of the electrical test signal. The frequency delta corresponds to the much lower frequency of the switching between sequences applied in the off phase to sequences applied in the on phase, and that much lower frequency is within the frequency range capable of detection at the detector. Thereby, an extremely high electrical test signal frequency is again translated to a much lower detection frequency capable of being detected by the detector.

FIG. 1 is an illustration of an example electron-beam prober 100 for performing stroboscopic electron beam signal image mapping, arranged in accordance with at least some implementations of the present disclosure. As shown in FIG. 1, e-beam prober 100 includes an e-beam column 112 within a housing 102. For example, e-beam column 112 may be an electron microscope column. E-beam column 112 includes an electron gun 103, which produces a pulsed electron beam in accordance with control by a pulse control signal 122. Pulse control signal 122 is provided to electron gun 103 by computing or control system 120. As shown, control system 120 further provides an electrical test signal 121 and receives a detected output signal 123, and may output test data 126. Details of control system 120 are discussed herein with respect to FIG. 2A.

E-beam column 112 further includes slim lenses 104, guide or enclosure 105, aperture system 106, a detector 107, and a guide 108 within enclosure 105. E-beam column 112 may include additional components to generate and guide a pulsed e-beam 113 and to detect secondary e-beam signal 116. As shown, under control of control system 120, e-beam column 112 emits or delivers pulsed e-beam 113 to a die 138 under test (or device under test, DUT). Furthermore, detector 107 receives and detects secondary e-beam signal 116 to provide output signal 123. Herein, one or both of secondary e-beam signal 116 and/or output signal 123 may be referred to as an imaging signal. Notably, secondary e-beam signal 116 includes secondary electrons that are reflected and/or emitted based on pulsed e-beam 113 and electrical test signal 121. As discussed further herein, secondary e-beam signal 116 is modulated based on the applied pulsed e-beam 113 and modulated electrical test signal 121. Thereby, a modulated imaging signal is reflected from the integrated circuit structure under test. The modulation is both in the reflected secondary electrons (or photons if a laser or other light source is used) and the signal corresponding to the reflected secondary electrons (i.e., in detected output signal 123 from detector 107). Herein, the term modulated imaging signal or modulated reflected signal refers to one or both of the reflected secondary electrons and/or the corresponding signal or data structure. For example, a modulated imaging signal may be received from an integrated circuit structure.

E-beam column 112, or at least a portion thereof, a stage 101 (under control of a stage controller), or at least a portion thereof, and probe 109 are within a chamber 110 enclosed by housing 102. Vacuum 125 may pull a vacuum within chamber 110 during testing of die 138. As illustrated, in some embodiments, probe 109 contacts regions 141 of front side 143 to provide electrical test signal 121 while pulsed e-beam 113 is emitted on front side 143. In other embodiments, probe 109 contacts regions 141 of a back side 144 of die 138 to provide electrical test signal 121 while pulsed e-beam 113 is emitted on back side 144. As used herein, the term front side indicates a side of a die or wafer where devices and/or metallization layers are being built up in a build up direction (i.e., the z-direction). The term back side indicates the side of the wafer opposite the front side. The back side may also include metallization layers to contact and provide electrical routing to devices (e.g., transistor devices and/or other active and passive devices) on the front side as devices becomes more complex. Notably, the techniques discussed herein inclusive of contacting a die under test using one or more probes and simultaneously imaging the die using a pulsed e-beam may be performed on front side 143 or back side 144.

Die 138 includes test structures and/or test contacts or pads that are designed for test or are part of the active devices of die 138. As used herein, the term die is inclusive of such active devices (e.g., part of an integrated circuit) and such test structures. As shown in expanded view 140, probe 109 contacts die 138 at regions 141. As used herein, the terms probe or prober indicates a device or structure that contacts one or more regions of a die to provide test signal(s) to the contacted regions. Such test signals may be any suitable signals to test, stress, evaluate, etc. the relevant structures of die 138. In some embodiments, probe 109 landing on regions 141 (e.g., probe pads) is automated using pattern recognition.

In some embodiments, probe 109 includes a number of probe tips 142 to contact corresponding regions 141 of die 138. Regions 141 may be any suitable material(s) depending on structures to be tested. In some embodiments, regions 141 are metal structures. In some embodiments, regions 141 are semiconductor structures. Although illustrated with regions 141 being immediately adjacent, a dielectric material may be provided between individual ones of regions 141. Each of probe tips 142, at various times, frequencies, etc. as testing dictates, transfers and/or receives modulated test signals 121 to or from corresponding regions 141 of die 138. Such regions 141 (i.e., contact regions) are in turn coupled to integrated circuit structures 146 in another region 150 of die 138. Regions 141 are coupled to circuit structures 146 to provide various testing routes for testing of die 138. Such testing routes or structures may be any suitable integrated circuit structures including relatively simple structures such as resistors, single device components (e.g., routes through transistor channels), or more complex testing routes or structures such as circuit components or the like. Notably, regions 141 may couple to any devices, structures, or materials at lower levels or layers than the layer or level at which contact is being made. Furthermore, during (and/or before and/or after) such providing of test signals 121 via probe 109, regions such as region 150 are exposed by pulsed e-beam 113 for e-beam imaging.

Although illustrated with respect to e-beam imaging, the discussed techniques may also be used in optical tools using a pulsed photon beam (i.e., a pulsed laser). The discussion relative to pulsed e-beams is equally relevant to pulsed laser beams. Similarly, discussion relative to reflected secondary electrons is equally relevant to reflected laser beams or other optical light sources. The discussed modulation of an imaging signal may be evident in e-beam, laser, or other light source contexts.

Figure 2A:
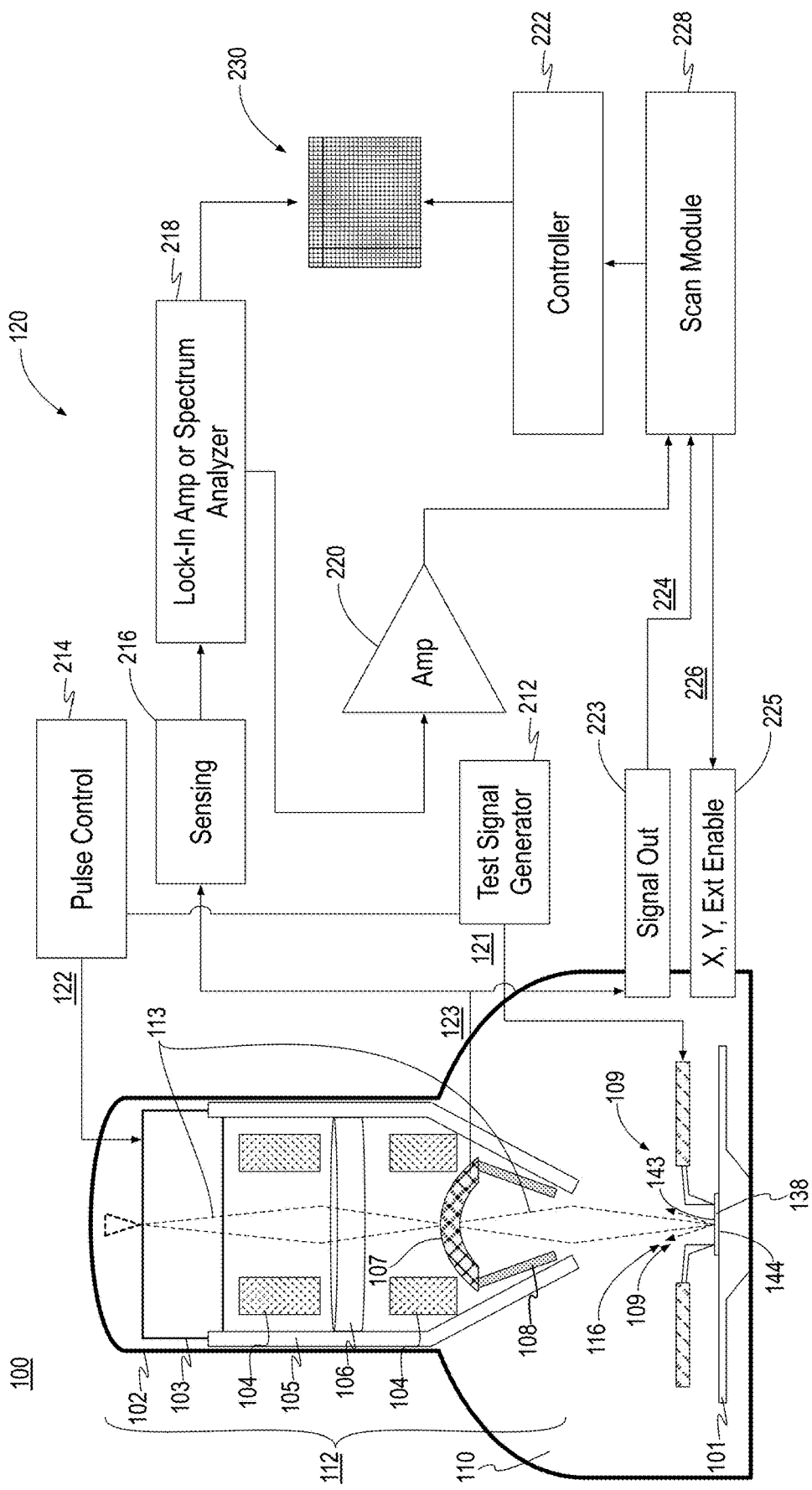
FIG. 2A is an illustration of an example control system deployed in the electron-beam prober of FIG. 1 to control stroboscopic electron beam signal image mapping.
Figure 2B:
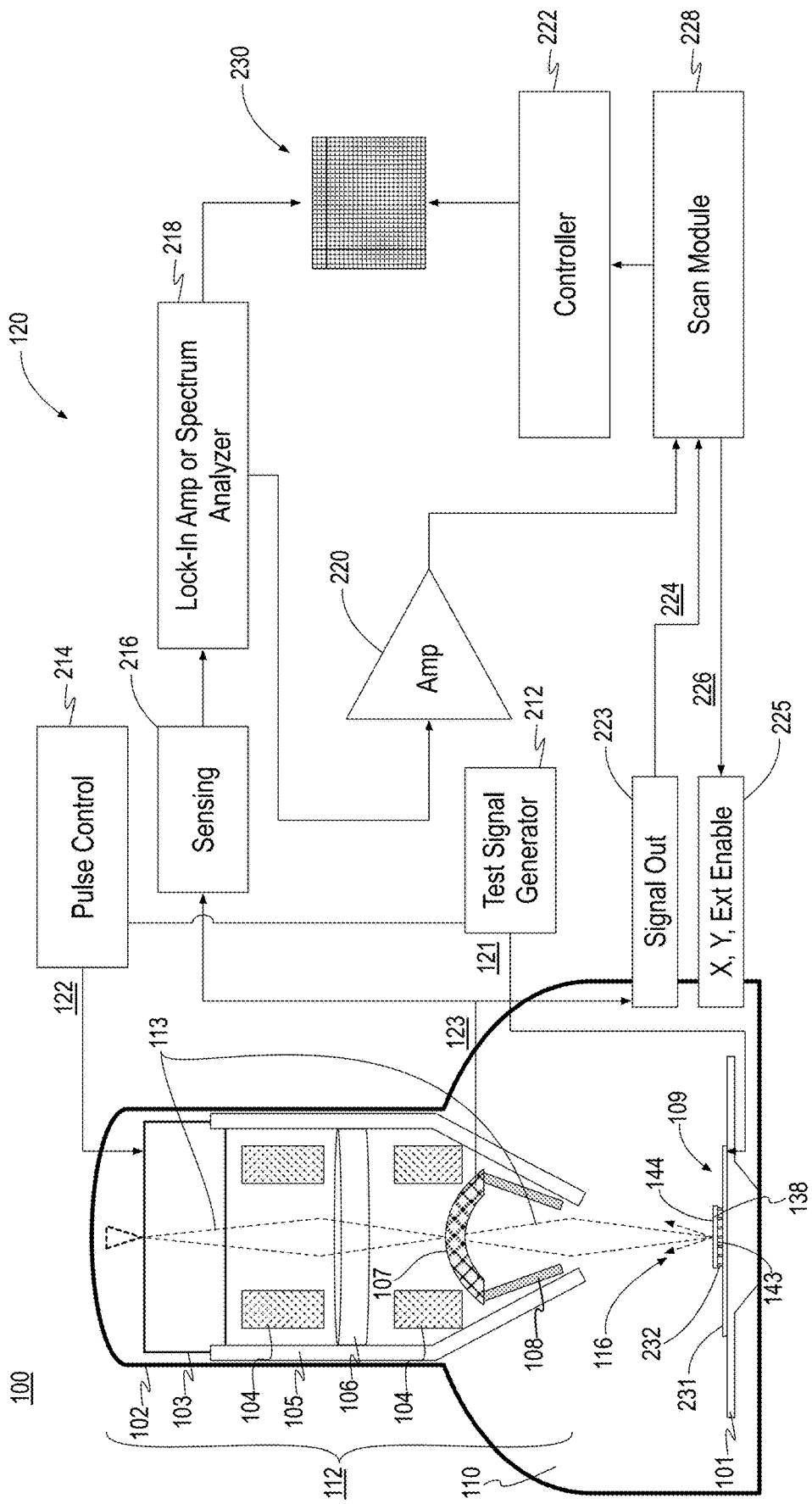
FIG. 2B is an illustration of an example electron-beam prober and control system to provide probe signals from below for stroboscopic electron beam signal image mapping.

FIG. 2A is an illustration of an example control system 120 deployed in electron-beam prober 100 to control stroboscopic electron beam signal image mapping, arranged in accordance with at least some implementations of the present disclosure. Notably, FIGS. 1 and 2A illustrate exemplary configurations using probing from the top (e.g., using a probe card from the top). FIG. 2B herein below illustrates probing from below (e.g., using a probe card from below). As shown in FIG. 2A, control system 120 may include a pulse control module 214, a sensing module 216, a lock-in amplifier or spectrum analyzer 218, an operation amplifier 220, a test signal generator 212, a computer or controller 222, a scan module 228, a signal output module 223, and a scan control module 225.

In e-beam prober 100, test signal generator 212 is coupled to prober 109, and test signal generator 212 provides a modulated high frequency electrical test signal to prober 109 for application to integrated circuit structures of die 138. As discussed, during application of the modulated high frequency electrical test signal, pulsed e-beam 113 is also applied to the integrated circuit structures of die 138. Detector 107 is in the path of secondary e-beam signal 116, which is modulated in accordance with the modulated high frequency electrical test signal and pulsed e-beam 113. Detector 107 may be any suitable detector such as a phosphor screen detector coupled with a photomultiplier (PMT). As discussed, the capability of detector 107 does not allow for sensing at the high frequencies that may be used by the modulated high frequency electrical test signal and pulsed e-beam 113. For example, the modulated high frequency electrical test signal and pulsed e-beam 113 may be deployed above 1 GHz while detector 107, and corresponding electronics, are only capable of detection at frequencies of 15 MHz or less.

Detector 107 is coupled to sensing module 216. Sensing module 216 may receive and pre-process the modulated electrical signal provided by detector 107 (i.e., a modulated electrical signal corresponding to an imaging signal such as a modulated signal of secondary electrons). Sensing module 216 is coupled to a lock-in amplifier or spectrum analyzer 218 which is coupled to operation amplifier 220. Lock-in amplifier or spectrum analyzer 218 locks into the frequency modulation of the modulated signal of secondary electrons to isolate the pertinent portions of the signal from background information or signal. For example, the techniques discussed herein below provide potentially positive test signal durations separated by expected durations of no test signal over time to establish an expected frequency. Lock-in amplifier or spectrum analyzer 218 locks in at this frequency to amplify and/or analyze the signal during those durations while ignoring background signals during other durations. Thereby, lock-in amplifier or spectrum analyzer 219 bolsters the expected resultant test signal out of the background signal.

Scan module 228 is coupled to the operation amplifier 220 and is capable of receiving a Scanning Electron Microscope (SEM) image signal 224 from signal output module 223 and/or sending external x-y scan control signals 226 to scan control module 225 (e.g., a control board of e-beam column 112). Computer or controller 222 may generate SEM images such as stroboscopic electron-beam signal image mapping images 230, and be able to overlay the stroboscopic electron-beam signal image mapping images 230 with the SEM image. Notably, image 230 may be compared to an expected image such that any discrepancies may indicate a device failure.

As discussed, FIGS. 1 and 2A illustrate exemplary configurations using probing from the top (e.g., using a probe card from the top), however, probing may be performed from below (e.g., using a probe card from below).

FIG. 2B is an illustration of an example electron-beam prober 100 inclusive of a control system to provide probe signals from below for stroboscopic electron beam signal image mapping, arranged in accordance with at least some implementations of the present disclosure. In the configuration of FIG. 2B, die 138 is flipped relative to the example of FIG. 2A such that front side 143 of die 138 is coupled to probe 109 by coupling die 138 to pins 232, which extend from board 231 of probe 109. Board 231 may be any electronics board such as a printed circuit board and may be characterized as a test board, an interface board, or the like. In some embodiments, die 138 is provided within a package such as a socket such that bumps (not shown) of die 138 are contacted to pins 232. For example, C4 bumps of die 138 may be coupled to pogo pins 232. Furthermore, die 138 may be clamped to by the socket in which die 138 is packaged) via clamp that can provide significant load on the coupling. As used herein, the term probe is inclusive of front and back side probe cards as illustrated herein.

Notably, testing progresses as discussed above with modulated test signals 121 being provided via board 231 and pins 232 of probe 109. Contemporaneously, a pulsed beam and modulated electrical test signals are provided to die 138 and secondary e-beam signal 116 is detected and processed as described herein. The configuration of FIG. 2B provides electron-beam prober 200 other advantages inclusive of high frequency signaling capability, the ability to probe many structures (e.g., 1,000 s of pogo pins 232 may be used), integration of heat management solutions to carefully control the temperature of die 138, routing of board 231 connectors and wiring from outside chamber 110, deployment of interposers that can be flipped for efficient processing, and others. In some embodiments, probing of both sides of die 138 is provided by adapting or mounting die 138 to an interposer such that front side 143 or back side 144 may face pulsed e-beam 113 during test.

Figure 3:
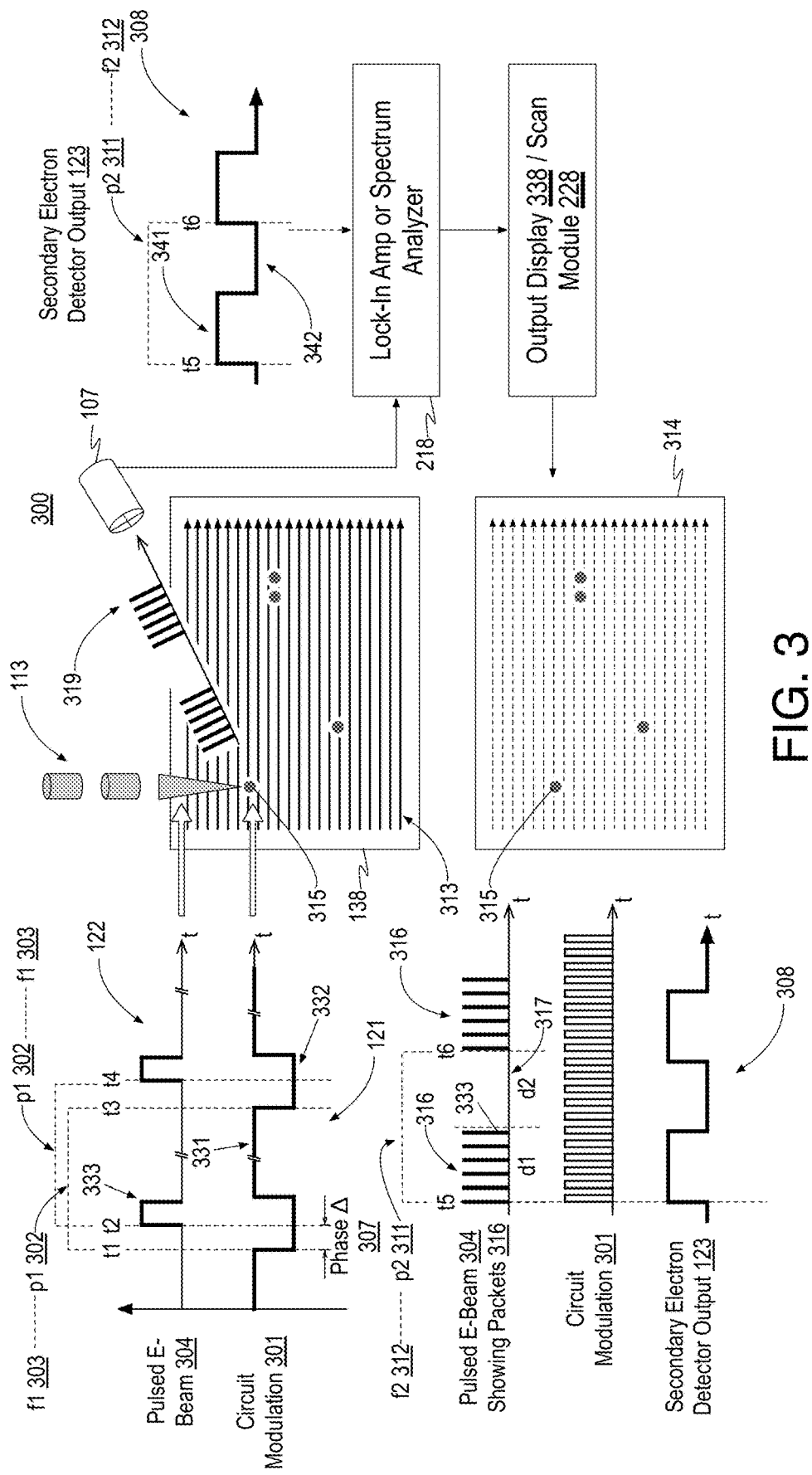
FIG. 3 is an illustration of an example stroboscopic electron-beam signal image mapping context using electron-beam wave packets.

FIG. 3 is an illustration of an example stroboscopic electron-beam signal image mapping context 300 using electron-beam wave packets, arranged in accordance with at least some implementations of the present disclosure. As shown in FIG. 3, a stroboscopic electron-beam signal image mapping image 314 (e.g., image 230) may be generated by scanning 313 pulsed e-beam 113 across die 138. For example, at a number of points such as test point 315, the following is repeated. At the test or image point or position, modulated electrical test signal 121 is provided to a pertinent integrated circuit structure, or the circuit is modulated through a test pattern and, contemporaneously, pulsed e-beam 113 is applied to the integrated circuit structure. As discussed, the nominal frequencies of modulated electrical test signal 121 and pulsed e-beam 113 are at too high for detection by detector 107. However, using the techniques discussed below, a resultant modulated signal 308 has signal features in the frequency range detectable by detector 107.

The detected resultant modulated signal 308 (e.g., of secondary electrons) is provided to lock-in amplifier or spectrum analyzer 218, which locks onto the frequency in the detectable frequency range of resultant modulated signal 308 and determines, for example, an intensity value for the current image point or position. Such processing is repeated for positions along scanning 313 at any suitable resolution to generate an intensity value, or similar imaging value, for each position of stroboscopic electron-beam signal image mapping (SESIM) image 314. SESIM image 314 may then be used for fault detection as discussed below. In FIG. 3, SESIM context 300 is illustrated with respect to wave packet techniques. However, SESIM context 300 is also relevant to frequency differential techniques discussed herein with respect to FIG. 6.

Turning now to modulated electrical test signal 121 and pulse control signal 122, modulated electrical test signal 121 provides for circuit modulation 301. For example, an integrated circuit structure under test is modulated in accordance with circuit modulation 301. Circuit modulation 301 may be a supplied voltage, current, or other electrical characteristic. In response to circuit modulation 301, the integrated circuit structure is expected to respond in some manner such as having a corresponding current, voltage, temperature change, or the like. The expected response is to be detected and imaged using pulsed e-beam 304. For example, pulse control signal 122 establishes a pulsed e-beam 113 at the point or position of imaging based on pulsed e-beam 304 (e.g., a pulsed e-beam modulation). The correlation between circuit modulation 301 and pulsed e-beam 304 (or an e-beam pulse train or pattern) allows detection using a lower frequency detector 107, as follows.

As shown, circuit modulation 301 has a frequency 303 (f1) that is the inverse of period 302 (p1). Period 302 may be established using any shared characteristic in the periodic pattern of circuit modulation 301 such as falling edge, as shown. In the illustrated example, period 302 is the difference between a falling edge time instance t3 and an immediately prior falling edge time instance t1 (i.e., p1=t3−t1). Other shared characteristics may be used. Frequency 303 may be any suitable electrical test frequency such as a frequency in the range of 1 GHz to 100 GHz. In some embodiments, frequency 303 is not less than 50 MHz. In some embodiments, frequency 303 is not less than 20 MHz. In some embodiments, frequency 303 is not less than 1 GHz.

Furthermore, circuit modulation 301 has on signal durations 331 and off signal durations 332. For example, on signal durations 331 are those durations between a rising edge and an immediately following falling edge of circuit modulation 301. Off signal durations 332 are those durations between a falling edge and an immediately following rising edge of circuit modulation 301. Notably, a voltage (or other electrical characteristic) may be applied during on signal durations 331 and no voltage (or a lower voltage) may be applied during off signal durations 332.

Similarly, pulsed e-beam 304 has a matching frequency 303 (f1) that is the inverse of period 302 (p1). Period 302, relative to pulsed e-beam 304, may be established using any shared characteristic in the periodic pattern of pulsed e-beam 304 such as rising edge, as shown. In the illustrated example, period 302 for pulsed e-beam 304 is the difference between a second rising edge time instance t4 and an immediately prior first rising edge time instance t3 (i.e., p1=t4−t2=t3−t1).

Furthermore, pulsed e-beam 304 and circuit modulation 301 are offset by a phase delta 307 that may be any suitable duration (e.g., time offset). In some embodiments, phase delta 307 is measured as a difference between a falling or rising edge of circuit modulation 301 and a rising edge of pulsed e-beam 304. Phase delta 307 is deployed to establish each pulse 333 of pulsed e-beam 304 within either an off signal duration 332 (as shown) or an on signal duration 331. Notably, examples herein may be pertinent to testing metallization structures such as metal lines that provide high secondary electron outputs at lower circuit modulation 301 (i.e., during off signal durations 332) due to the electrons not being captured during such off signal durations 332. However, pulses 333 may be aligned with on signal durations 331 during other testing contexts. As discussed, phase delta 307 advantageously establishes each pulse 333 of pulsed e-beam 304 within either an off signal duration 332 (as shown) or an on signal duration 331. In some embodiments, phase delta 307 is a time offset, as shown, that is less than individual ones of off signal durations 332 or on signal durations 331.

By providing pulsed e-beam 304 having a frequency that matches that of circuit modulation 301 while providing phase delta 307 to establish each pulse 333 is applied during the pertinent characteristic (e.g., on or off) of circuit modulation 301, pulses 333 of pulsed e-beam 304 are applied at time instances (e.g., t2, t4, and so on) pertinent to generate a detectable signal of secondary electrons at detector 107. However, such signals are at a frequency that detector 107 is unable to distinguish.

Moving now to the illustrated signal diagram of pulsed e-beam 304 showing packets 316, a number of pulses 333 are packetized or batched into a packet 316 of pulses 333. In the signal waveforms illustrated with respect to pulsed e-beam 304 showing packets 316, the time axis is at a greater scale than those illustrated with respect to the illustration of pulsed e-beam 304 previously discussed. As shown, pulses 333 within packet 316 are provided at frequency 303 (f1), as discussed above, over a duration of time d1. Therefore, during duration d1, a secondary electron beam, if present, is detectable at detector 107. During an immediately subsequent duration 317 of time d2, no pulses are provided. Therefore, during duration 317, no secondary electron beam may be detected as no pulses 333 are provided. Although discussed with respect to no pulses 333 being provided during time 317, a low level of pulsing may be present, though undesirable, without influencing the test results.

Then, packets 316 of pulsed e-beam 304 showing packets 316 are deployed at a frequency much lower than frequency 303. That is, packets 316 of pulsed e-beam 304 have a frequency 312 (f2) that is the inverse of period 311 (p2). Period 311 may be established using any shared characteristic in the periodic pattern of packets 316 of pulsed e-beam 304 such as a first pulse in the packet, as shown. In the illustrated example, period 311 is the difference between a first packet time instance t6 and an immediately prior first packet time instance t5 (i.e., p2=t6−t5). Frequency 312 may be any suitable electrical test frequency such as a frequency in the range of 1 MHz to 15 MHz. In some embodiments, frequency 312 is not more than 10 MHz. In some embodiments, frequency 312 is not more than 7 MHz. In some embodiments, frequency 312 is not more than 5 MHz.

A resultant secondary electron signal 319 (e.g., a modulated imaging signal of secondary electrons or photons) from the integrated circuit structure under test is then received by detector 107. Resultant secondary electron signal 319 includes spikes of secondary electrons corresponding to pulses 333 packetized as discussed with respect to pulsed e-beam 304. That is, the physical response of the integrated circuit structure under test (if operable) has a modulated signal corresponding to that of a combination of pulsed e-beam 304 and circuit modulation 301, which in this context reflects the signal structure of pulsed e-beam 304 (as each pulse of pulsed e-beam 304 is aligned with a characteristic of circuit modulation 301 to elicit a response). As discussed, detector 107 cannot resolve between pulses 333 within packets 316. However, detector 107, along with lock-in amplifier or spectrum analyzer 218 is able to distinguish the signal frequency of packets 316 of e pulsed e-beam 304 and, therefore, the frequency of resultant secondary electron signal 319. As shown with respect to output modulated signal 308.

The resultant modulated signal 308 has frequency 312 (f2) based on period 311 (p2) in analogy to that of the packet frequency of pulsed e-beam 304. For example, the portions of resultant secondary electron signal 319 corresponding to packets 316 return a signal that may be aggregated by detector 107 (due to detector 107 not being able to temporally resolve the responses from the pulses) to provide a strong signal response 341 (due to an operable device, for example) while those portions of resultant secondary electron signal 319 corresponding to durations 317 have no or little signal response 342 due to corresponding only to background condition. By tuning to frequency 312 and evaluating only response portions 341, an output dependent on only the result of the test of the device (e.g., with background signal removed) is provided in image 314. Notably, the illustrated example shows an operable integrated circuit structure. In cases where the integrated circuit structure is inoperable, the resultant modulated signal 308 would not have strong signal response 341 but would instead be relatively flat, inclusive of only background signal.

For example, during one circuit modulation cycle of circuit modulation 301, an electrical node (e.g., integrated circuit structure) under test goes through high and low voltage phases (e.g., on signal durations 331 and off signal durations 332). At the high voltage phase, the secondary electron yield from detector 107 will be lower and at the low voltage phase the secondary electron yield will be higher (or vice versa). When pulsed e-beam 113 is synchronized to the low (or high) voltage phase, the overall average secondary electron yield will be high (or low). Therefore, the secondary electron detector yield at detector 107 can be used to map out locations where the signal modulation exists. It is noted, however, since the secondary electron yield at detector 107 is also affected by many other factors such as materials and geometry there may be many noise signals if the secondary electron yield is mapped without the discussed e-beam pulsing by pulsed e-beam 113. Furthermore, to improve the signal to noise ratio, lock-in techniques as deployed by lock-in amplifier or spectrum analyzer 218 may be leveraged. As discussed, since the circuit modulation frequency of circuit modulation 301 can be well above the response range of detector 107, a lower frequency modulation of the secondary electron yield is provided by electron-beam wave packets techniques discussed with respect to FIG. 3 or frequency differential techniques discussed with respect to FIG. 6.

In the context of FIG. 3, the wave packet (or wave train) technique is deployed. In this technique, electron beam 113 is pulsed at the frequency of circuit modulation 301 within packets 316 (or short bursts). Instantiations of packets 316 are deployed at the selected frequency 312. For example, frequency 303 of pulses in circuit modulation 301 may be characterized as f1 and frequency 312 of packets 316 (e.g., the packet modulation) may be characterized as f2. The average secondary electron yield (e.g., as detected by detector 107) under the packet pulsing electron beam of pulsed e-beam 304 that is synchronized to circuit modulation 301 (i.e., having the same frequency of pulses within packets 316) exhibits modulations at frequency 312, f2. If frequency 312, f2, is lower than the maximum frequency response range of detector 107, then the signal can be detected by detector 107, as discussed.

As shown, the secondary electron signal of modulated signal 308 is then be sent to lock-in amplifier or spectrum analyzer 218 tuned to frequency 312, f2. Deployment of lock-in amplifier or spectrum analyzer 218 significantly improves the signal to noise ratio. The output of lock-in amplifier or spectrum analyzer 218 is fed into a scan control unit (e.g., scan module 228) that raster scans over the area of die 138. When pulsed e-beam 113 illuminates part of a circuit element (i.e., integrated circuit structure) such as a metal line or silicon under a device, the secondary electron emission detected by detector 107 is modulated by the electrical signal of circuit modulation 301 and the packet modulation of pulsed e-beam 304. If pulsed e-beam 304 is synchronized to the low voltage-phase (as shown), then the locations where there is high output from lock-in amplifier or spectrum analyzer 218 indicates the position of the device (i.e., the integrated circuit structure) is carrying circuit modulation 301. In the map display, those devices or circuit nodes (i.e., the integrated circuit structure) display the contrast against those positions that exhibit background. This allows the mapping of devices that toggle at the driving frequency, for example. By comparing with the expected integrated circuit structure layout, defective devices may be detected if these devices (i.e., the integrated circuit structure) are operated at the given frequency but do not show the modulated secondary electron signal. A corresponding image may be displayed via output display 338.

Figure 4:
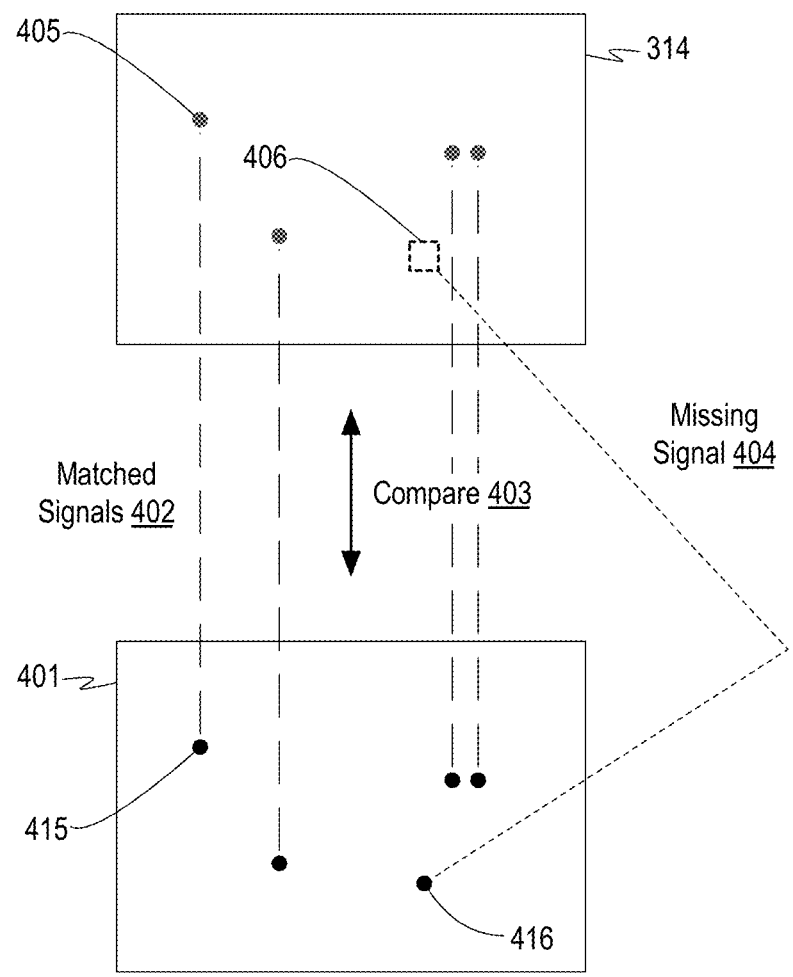
FIG. 4 is an illustration of an example comparison of a resultant stroboscopic electron-beam signal image mapping image with a predefined device mapping to detect defective integrated circuit structures.

FIG. 4 is an illustration of an example comparison of a resultant stroboscopic electron-beam signal image mapping image 314 with a predefined device mapping 401 to detect defective integrated circuit structures, arranged in accordance with at least some implementations of the present disclosure. As shown in FIG. 4, resultant SESIM image 314 indicates functional devices at four locations inclusive of location 405. In practice, SESIM image 314 may indicate tens, hundreds, thousands or more functional devices.

Based on predefined device mapping 401, it is expected that five locations inclusive of expected location 415 include functional devices. Using comparison operation 403, it is determined that expected locations 415 outside of expected location 416 has a collocated matched signal 402. However, expected location 416 does not have matched collocated signal and therefore has a missing signal 404. Using such image data comparison, which may be aided by automated image learning tools, neural networks, and the like it is determined that a device (i.e., integrated circuit structure) at or corresponding to location 406 is a failed device. Thereby, quick and accurate locating of failed devices is achieved using the discussed stroboscopic electron-beam signal image mapping techniques. It is noted that such image data comparison techniques may be deployed based on resultant SESIM image 314 generated using electron-beam wave packets techniques discussed with respect to FIG. 3 or frequency differential techniques discussed with respect to FIG. 6.

Figure 5:
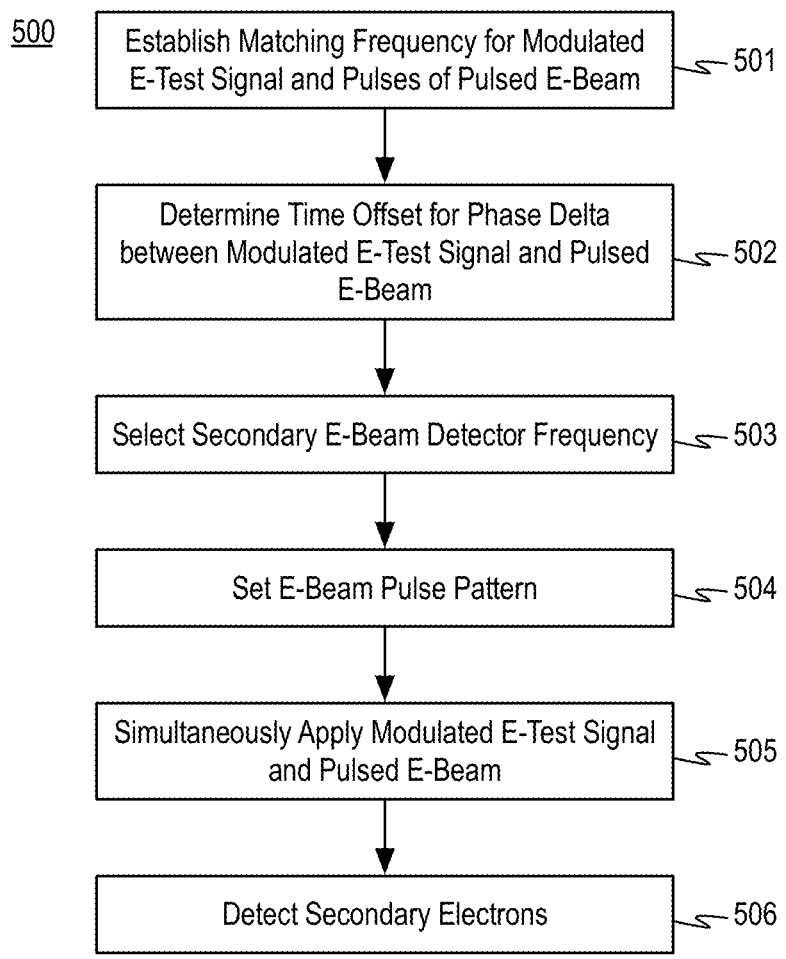
FIG. 5 is a flow diagram illustrating an example process for using a pulsed electron-beam having low frequency packets of high frequency pulses to generate a stroboscopic electron-beam signal image mapping image.

FIG. 5 is a flow diagram illustrating an example process 500 for using a pulsed electron-beam having low frequency packets of high frequency pulses to generate a stroboscopic electron-beam signal image mapping image, arranged in accordance with at least some implementations of the present disclosure. As shown, process 500 begins at operation 501, where a matched frequency for a modulated electrical test signal and high frequency pulses of a pulsed e-beam is established. In some embodiments, a frequency of a high speed modulated electrical test signal is predefined and the frequency of the pulses within each packet or batch of pulses is matched to the high speed frequency of the modulated electrical test signal.

Processing continues at operation 502, where a time offset for a phase delta between the modulated electrical test signal and the high frequency pulses of a pulsed e-beam is determined. The time offset or phase delta may be determined using any suitable technique or techniques. In some embodiments, a determination is made as to the position in the modulated electrical test signal the pulses of the e-beam must correspond to so that the desired response is provided at the integrated circuit structure under test. In some embodiments, the pulses must sync with either a high voltage or low voltage of the modulated electrical test signal. The high frequency pulses of the pulsed e-beam are then offset with respect to the wave pattern of the modulated electrical test signal to synch the pulses of a pulsed e-beam to have the pulses delivered in the pertinent phase of the modulated electrical test signal. Furthermore, the time offset or phase delta may be established between any suitable repeating characteristics of the modulated electrical test signal and the high frequency pulses of a pulsed e-beam.

Processing continues at operation 503, where the frequency of the secondary e-beam detector is selected or determined. The frequency of the secondary e-beam detector may be determined using any suitable technique or techniques. In some embodiments, the frequency of the secondary e-beam detector is determined based on the characteristics or capabilities of the detector. For example, phosphor screen detectors are limited by a lag time or decay time of the detector that limits the detection frequency. For example, a detector may have a detection frequency limit at or below about 15 MHz.

Processing continues at operation 504, where an e-beam pulse pattern is set or established. In some embodiments, the e-beam pulse pattern is set by first establishing a packet pattern at or below the frequency determined at operation 503. In some embodiments, the period of the frequency determined at operation 503 is evenly divided into a packet phase (i.e., when pulse packets are provided) and a no pulse phase (i.e., when no pulses are delivered). However, the period of the frequency may be divided into any proportions. Once the duration of the packet phase is determined, the pulse frequency is overlaid onto the packet phase to define the pulsing times and number of pulses in each packet (or batch) of high frequency pulses. Operations 501-504 may define a pre-implementation phase of process 500.

Processing continues at operation 505, where the modulated electrical test signal defined at operation 501 and the e-beam pulse pattern (i.e., having packets each including high frequency pulses with the packet frequency at the secondary e-beam detector frequency) set at operations 501-504 are simultaneously or contemporaneously applied to a device, structure, integrated circuit structure, or element under test. For example, the modulated electrical test signal may be applied via a prober and the e-beam pulse pattern may be applied via an e-beam column as discussed herein.

Processing continues at operation 506, where secondary electrons from the applied e-beam pulse pattern and modulated or affected by the modulated electrical test signal are detected. As discussed herein, due to the lower frequency of the packets of the e-beam pulse pattern, the detector is capable of differentiating between phases when a test signal is applied (and a resultant signal is received if the device is operational) and phases when no test signal is applied. A lock-in amplifier or spectrum analyzer is locked to the packet frequency and the intensity of the signal at that frequency is analyzed to determine an intensity or similar value for each position tested. The resultant intensity pattern is mapped to form an image and compared to an expected mapping or image to detect failing structures as discussed with respect to FIG. 4 and elsewhere herein.

Discussion now turns to lowering or raising the frequency of the detected signal relative to the input frequency of a modulated electrical test signal and high frequency pulses of a pulsed e-beam using frequency differential techniques. Such frequency differential techniques may be deployed using any systems and in any context discussed herein inclusive of stroboscopic electron-beam signal image mapping context 300. For example, a modulated electrical test signal and pulsed e-beam in accordance with those of FIG. 6 may be provided by electronic beam prober 100 and in context 300 to generate a modulated output signal. The context of FIG. 3 is not repeated for the sake of brevity and clarity of presentation.

Figure 6:
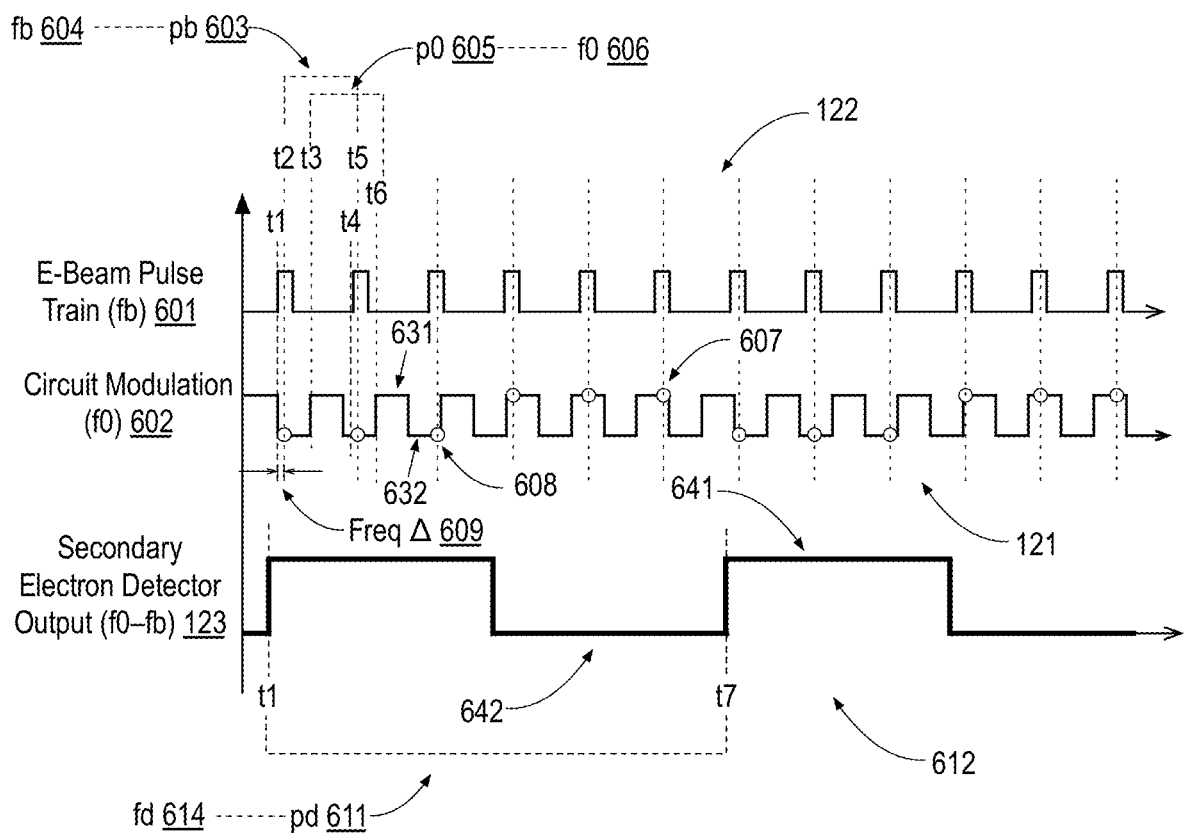
FIG. 6 is an illustration of example electrical test signal modulation and an example pulsed e-beam to generate stroboscopic electron-beam signal image mapping using a frequency differential.

FIG. 6 is an illustration of example electrical test signal modulation 301 and an example pulsed e-beam 601 to generate stroboscopic electron-beam signal image mapping using a frequency differential, arranged in accordance with at least some implementations of the present disclosure. With reference to FIG. 3, SESIM image 314 may be generated by scanning pulsed e-beam 601 across die 138 during application of electrical test signal circuit modulation 602. The detected resultant modulated signal 308 (e.g., of secondary electrons) is provided to lock-in amplifier or spectrum analyzer 218, which locks onto the frequency in the detectable frequency range of resultant modulated signal 308 and determines, for example, an intensity value for each tested image point or position.

Turning now to modulated electrical test signal 121 and pulse control signal 122, modulated electrical test signal 121 deploys circuit modulation 602. Circuit modulation 602 may have any characteristics discussed with respect to circuit modulation 301 and is applied to die 138 in the same manner. The expected response from circuit modulation 602 is to be detected (if present) and imaged using pulsed e-beam 601, which may also be characterized as an e-beam pulse train. For example, the correlation between circuit modulation 602 and pulsed e-beam 601 allows detection using lower frequency detector 107.

As shown, circuit modulation 602 has a frequency f0 that is the inverse of period 605 (p0). Period 605 may be established using any shared characteristic in the periodic pattern of circuit modulation 602 such as rising edge, as shown. In the illustrated example, period 605 is the difference between a rising edge time instance t6 and an immediately prior falling edge time instance t4 (i.e., p0=t6−t3).

Frequency 606 may be any suitable electrical test frequency discussed herein such as a frequency in the range of 1 GHz to 100 GHz. Furthermore, circuit modulation 602 has on signal durations 631 and off signal durations 632 in analogy with on signal durations 331 and off signal durations 332.

Pulsed e-beam 601 has a different frequency 604 (*fb*) that is the inverse of period 603 (*pb*). Period 603 of pulsed e-beam 601 may again be established using any shared characteristic in the periodic pattern of pulsed e-beam 601 such as rising edge, as shown. In the illustrated example, period 603 for pulsed e-beam 601 is the difference between a second rising edge time instance t4 and an immediately prior first rising edge time instance t1 (i.e., pb=t4−t1).

Frequency 604 (*fb*) of pulsed e-beam 601 and of pulsed e-beam 601 of circuit modulation 602 have a frequency difference or delta 609, therebetween that establishes a lower frequency for detected output signal 123. As shown, a resultant modulated signal 308 detected at detector 107 has a frequency 614 (*fd*) that is the inverse of period 611 (*pd*). Period 611 of modulated signal 308 is a locked in frequency and is illustrated using the shared characteristic of an expected periodic rising edge in modulated signal 308. That is, for a functional device, the illustrated modulated signal 308 is expected. However, if the device is non-functional, no such strong signal response 341 will be evident. In the illustrated example, period 611 is the difference between a rising edge time instance t7 and an immediately prior rising edge time instance t1 (i.e., pd=t7−t1).

As shown, due to frequency delta 609, pulsed e-beam 601 and circuit modulation 602 drift relative to one another. For example, using circuit modulation 602 as the baseline, pulsed e-beam 601 is seen to drift along the periodic pattern such that particular pulses interest at off signal intersections 608 and other ones of the pulses interest at on signal intersections 607. Furthermore, the drift due frequency delta 609 is such that the consecutive ones of off signal intersections 608 are provided (i.e., with no on signal intersections therebetween), followed by consecutive ones of on signal intersections 608. As discussed, on or off intersections provide an expected signal response and the other does not, with positive responses corresponding to off signal intersections 608 herein. Such consecutive or batched same type e-beam and signal intersections provide lower frequencies of (expected) strong signal responses 641 and no or little signal response 642 in analogy with strong signal responses 341 and no or little signal response 342, that may be detected by detector 107. By tuning to frequency 614 and evaluating only response portions 641, an output dependent on only the result of the test of the device (e.g., with background signal removed) is provided. Notably, the illustrated example shows an operable integrated circuit structure. In cases where the integrated circuit structure is inoperable, the resultant modulated output signal 612 would not have strong signal response 641 but would instead be relatively flat, inclusive of only background signal.

In the context of FIG. 6, the frequency differential technique is used. In this technique, pulsed e-beam 601 is at a slightly different frequency than electrical test signal circuit modulation 602. For example, frequency 606 of electrical test signal circuit modulation 602 is f0 and frequency 604 of pulsed e-beam 601 is fb. Due to frequency delta 609, the pulsing of pulsed e-beam 601 alternates between high and low voltage phase of electrical test signal circuit modulation 602 at a frequency that is the difference between f0 and fb. For example, given the absolute difference between the two frequencies, fd, the average secondary electron yield at detector 107 shows a modulation at frequency 614, fd=f0−fb. By locking into frequency 614, fd, at detector 107, mapping the location of the device is attainable at frequency 614, fd, when the device is tested at frequency 606, f0.

For example, Expression (1) provides a model of the secondary electron yield under circuit modulation 602:

$$K0 + K1 * Vcc * \cos(f0 * t) \quad (1)$$

where K0 is background electron yield, K1 is electron yield when voltage is applied, Vcc is the voltage applied by circuit modulation 602, f0 is the frequency of circuit modulation 602, and t is time.

Expression (2) describes the pulsing of pulsed e-beam 601:

$$P * \cos(fb * t + fi) \quad (2)$$

where P is the pulse intensity, fb is the frequency of pulsed e-beam 601, t is time, and fi is a phase shift, if any.

Expressions (3) then provide the output after mixing the secondary electron yield under circuit modulation 602 and the applied pulse:

$$(K0 + K1 * Vcc * \cos(f0 * t)) * P * \cos(fb * t + fi) = K0 * P * \cos(fb * t + fi) + K1 * P * \cos(f0 * t) * \cos(fb * t + fi)$$
$$= K0 * P * \cos(fb * t + fi) + K1 * P * 0.5 * [\cos((f0 + fb)t + fi) + \cos((f0 - fb)t - fi)] \quad (3)$$

which shows, in the bolded portion, the output after mixing has a detectable component at frequency delta 609, f0−fb (i.e., cos((f0−fb)t−fi).

As with the context of FIG. 3, and with reference thereto, the secondary electron signal of modulated output signal 612 is then be sent to lock-in amplifier or spectrum analyzer 218 tuned to frequency 614, fd with the use of lock-in amplifier or spectrum analyzer 218 significantly improves the signal to noise ratio. The output of lock-in amplifier or spectrum analyzer 218 is fed to a scan control unit that raster scans over the area of die 138 such that, when pulsed e-beam 113 illuminates part of a circuit element, the secondary electron emission detected by detector 107 is modulated by the electrical signal of circuit modulation 602 and the modulation of pulsed e-beam 601 with locations where there is high output from lock-in amplifier or spectrum analyzer 218 indicating the position of the device is active (i.e., non-failing). After the scan, a map display is generated with those devices displaying high contrast against those positions that exhibit background indicating functional devices. By comparing the test mapping with the expected integrated circuit structure layout, defective devices may be detected as discussed with respect to FIG. 4, for example.

Figure 7:
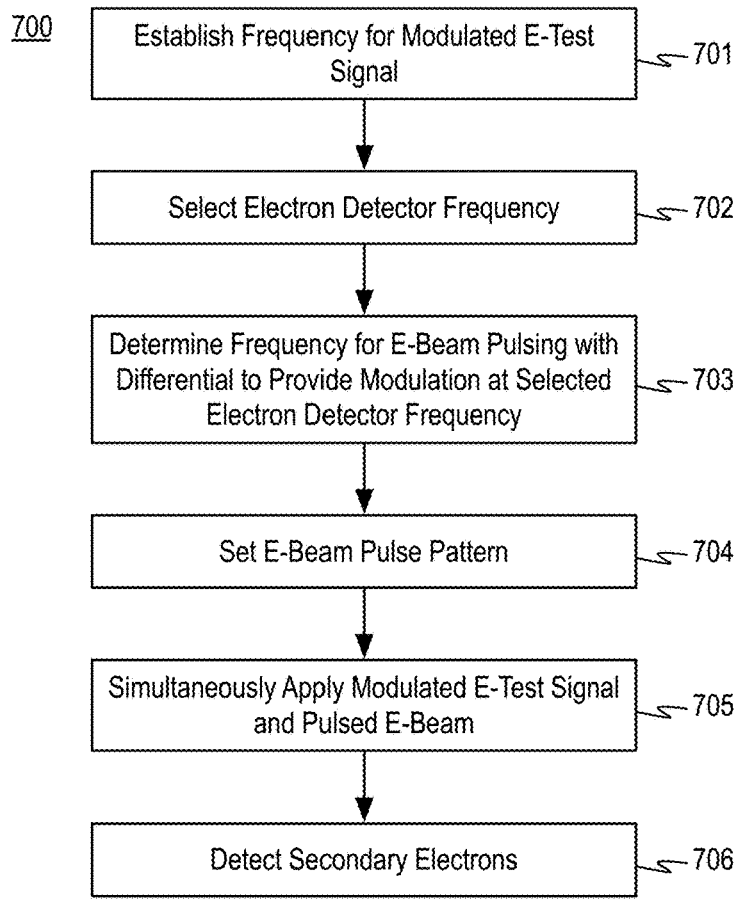
FIG. 7 is a flow diagram illustrating an example process for using a pulsed electron-beam having a frequency offset relative to a circuit modulation to generate a stroboscopic electron-beam signal image mapping image.

FIG. 7 is a flow diagram illustrating an example process 700 for using a pulsed electron-beam having a frequency offset relative to a circuit modulation to generate a stroboscopic electron-beam signal image mapping image, arranged in accordance with at least some implementations of the present disclosure. As shown, process 700 begins at operation 701, where a frequency for a modulated electrical test signal is established using any suitable technique or techniques. In some embodiments, a frequency of a high speed modulated electrical test signal is predefined or selected to test or stress an integrated circuit component of a die under test.

Processing continues at operation 702, where the frequency of a secondary e-beam detector is selected or determined. In some embodiments, the frequency of the secondary e-beam detector is determined based on the characteristics or capabilities of the detector. In some embodiments, the detector is a phosphor screen detectors having a detection frequency limited by a lag time or decay time of the detector. For example, a detector may have a detection frequency limit at or below about 15 MHz.

Processing continues at operation 703, where an e-beam pulsing frequency is determined such that he selected e-beam pulsing frequency has a frequency differential with respect to the modulated electrical test signal frequency selected at operation 701 to provide modulation of a resultant secondary electron signal at the secondary e-beam detector frequency determined at operation 702. In some embodiments, the frequency differential or frequency delta between the e-beam pulsing frequency and the modulated electrical test signal frequency is equal to the secondary e-beam detector frequency. For example, given the modulated electrical test signal frequency, f0, and the secondary e-beam detector frequency, fd, the e-beam pulsing frequency may be determined as the sum of the modulated electrical test signal frequency, f0, and the secondary e-beam detector frequency, fd (i.e., fb=fd+f0).

Processing continues at operation 704, where an e-beam pulse pattern is set or established. In some embodiments, the e-beam pulse pattern is set based on the e-beam detector frequency determined at operation 703. For example, the e-beam pulse pattern may be a substantially constant pulse pattern or pulse train with pulses at the e-beam pulsing frequency determined at operation 703. Operations 701-704 may define a pre-implementation phase of process 700.

Processing continues at operation 705, where the modulated electrical test signal defined at operation 701 and the e-beam pulse pattern (i.e., having a frequency delta with respect to the modulated electrical test signal) set at operations 701-704 are simultaneously or contemporaneously applied to a device, structure, integrated circuit structure, or element under test. For example, the modulated electrical test signal may be applied via a prober and the e-beam pulse pattern may be applied via an e-beam column as discussed herein.

Processing continues at operation 706, where secondary electrons from the applied e-beam pulse pattern and modulated or affected by the modulated electrical test signal are detected. As discussed, due to the lower frequency of the resultant signal as provided by the drift between the e-beam pulse pattern and the modulated electrical test signal, the detector is capable of differentiating between phases when a test signal is expected to be received (and a resultant signal is received if the device is operational) and phases when no test signal is expected. A lock-in amplifier or spectrum analyzer is locked to such frequency and that frequency is analyzed to determine an intensity or similar value for each position tested. The resultant intensity pattern is mapped to form an image and compared to an expected mapping or image to detect failing structures as discussed with respect to FIG. 4 and elsewhere herein.

Discussion now turns to lowering or raising the frequency of the detected signal relative to the input frequency of a modulated electrical test signal and high frequency pulses of a pulsed e-beam using frequency differential techniques. Such frequency differential techniques may be deployed using any systems and in any context discussed herein inclusive of stroboscopic electron-beam signal image mapping context 300. For example, a modulated electrical test signal and pulsed e-beam in accordance with those of FIG. 6 may be provided by electronic beam prober 100 and in context 300 to generate a modulated output signal. The context of FIG. 3 is not repeated for the sake of brevity and clarity of presentation.

Figure 8:
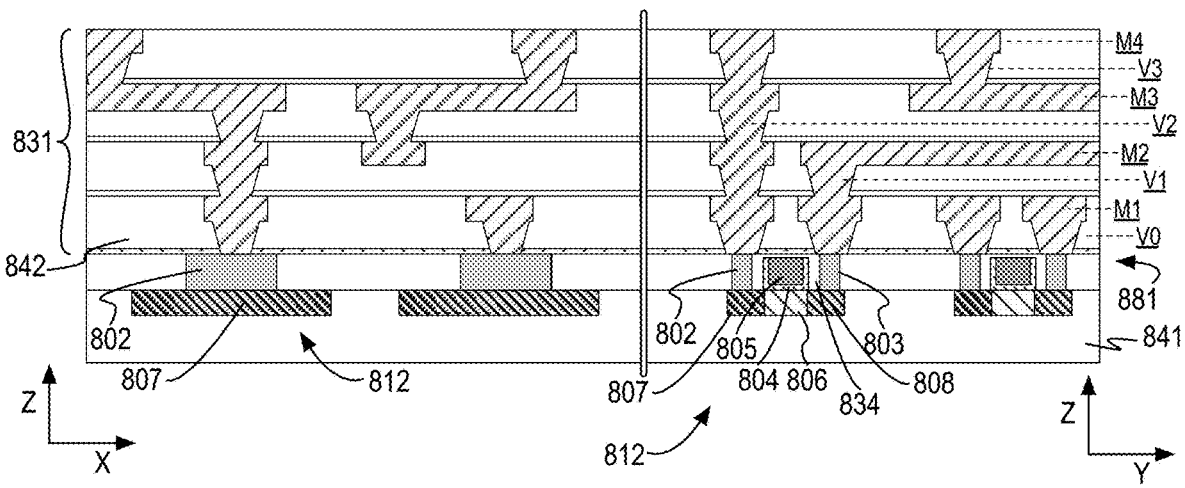
FIG. 8 illustrates cross-sectional side views of example device structures for pulsed electron-beam probe testing.

FIG. 8 illustrates cross-sectional side views of example device structures 800 for pulsed electron-beam probe testing, arranged in accordance with at least some implementations of the present disclosure. For example, device structures 800 may be or include partially or fully fabricated integrated circuit structures. As discussed, pulsed e-probe testing may be performed on any suitable device structures. FIG. 8 illustrates in-line device structures for test, however, final device structures may also be tested. On the left of FIG. 8, a parallel to gate view 891 is provided such that parallel to the gate refers to the gate of transistor 812. On the right of FIG. 8, an orthogonal to gate view 892 is provided such that orthogonal to the gate refers to the gate of transistor 812. Such views are divided by a vertical line to indicate they are separate views and are not a continuous view of device structures 800.

As shown in FIG. 8, circuitry 881 may be formed on and/or over substrate 841, such that circuitry 881 includes transistors 812. Transistors 812 include semiconductor channel structures 806 between source and drain structures 807, 808. Channel structure 806 and source and drain structures 807, 808 may be formed in a doped well of substrate 841 or they may be formed within and/or over substrate 841. Source and drain contacts 802, 803 are on source and drain structures 807, 808 and separated from a gate structure (inclusive of gate electrode 805 and gate dielectric layer 804) by optional dielectric spacers 834. For example, source and drain contacts 802, 803 may define a transistor contact layer. In some embodiments, the transistor contact layer further includes gate contacts. Gate electrode 805 may include any suitable material such as a metal or highly doped material. For example, gate electrode 805 may be or include ruthenium, palladium, platinum, cobalt, nickel, conductive metal oxides, hafnium, zirconium, titanium, tantalum, aluminum, alloys of these metals, carbides of these metals, or others. Transistors 812 may be formed using any suitable technique or techniques such as deposition techniques, patterning (e.g., lithography and etch) techniques, implant techniques, planarization techniques, epitaxial growth techniques, and so on.

Device structures further include metallization layers 831 embedded in dielectric material 842. Metallization layers 831 may be any suitable metal and provide interconnection of transistors 812 and any other devices of circuitry 881. Metallization layers 831 may be formed using any suitable technique or techniques such as single or dual damascene techniques or the like. Although illustrating metal layers M1-M4 and via layers V0-V3, any number of such layers may be deployed such as metal layers M1-M11 and via layers V0-V10, or the like. Although shown with V0 directly on the transistor contact layer including source and drain contacts 802, 803, in other embodiments a metal layer is directly on the transistor contact layer.

As discussed herein, at any layer of circuitry 881 and/or metallization layers 831, testing may be performed on device structures of active circuitry 881 or corresponding test structures adjacent circuitry 881. In some embodiments, probe 109 is to contact a region of die 138 such that region 141 is part of one of metallization layers 831. In some embodiments, the contacted metallization layer is a first or second metal layer directly over the transistor contact layer including source and drain contacts 802, 803. For example, probe 109 may contact a metallization that is a part of V0 or M1. In some embodiments, probe 109 contacts a metallization structure that is a part of V0, M1, V1, M2, V2, M3, V3, or M4. However, any metallization may be contacted. Such metallization contact may be used to evaluate a semiconductor material such as channel structure 806, or a semiconductor material may be contacted directly. For example, probe 109 may contact region 141 such that region 141 is a part of a layer including channel structure 806.

Figure 9:
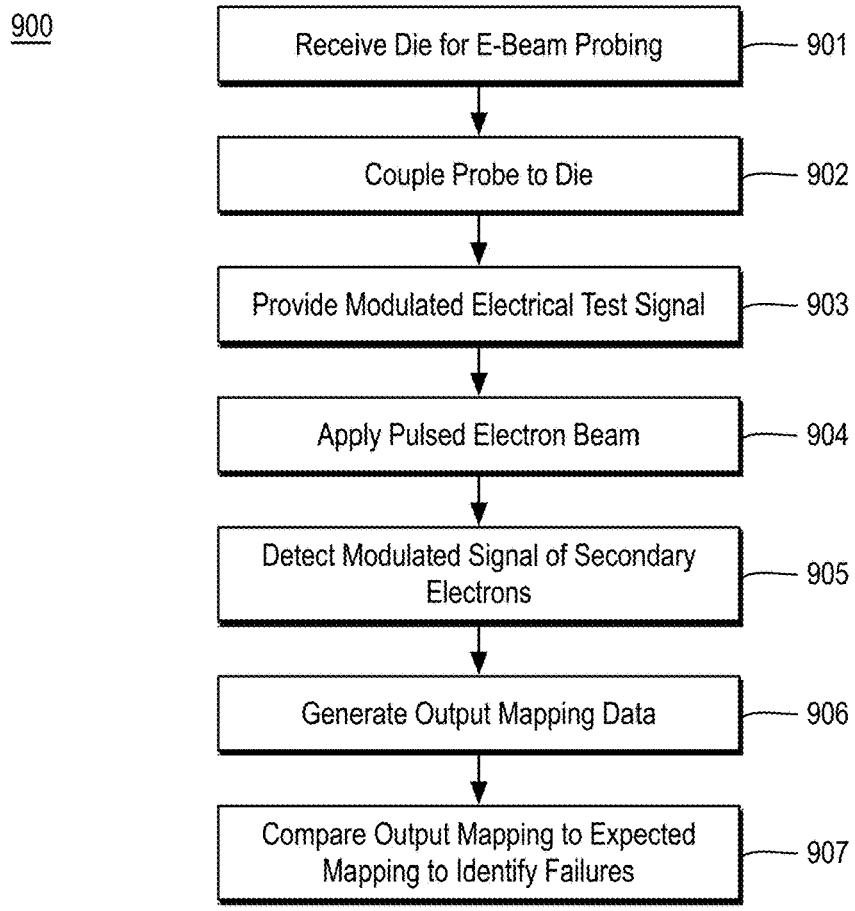
FIG. 9 is a flow diagram illustrating an example process for performing pulsed electron-beam prober testing.

FIG. 9 is a flow diagram illustrating an example process 900 for performing pulsed electron-beam prober testing, arranged in accordance with at least some implementations of the present disclosure. Process 900 may include one or more operations 901-907 as illustrated in FIG. 9. Process 900 may form at least part of a pulsed e-beam probing process. Furthermore, process 900 will be described herein with reference to system 1000 of FIG. 10.

Figure 10:
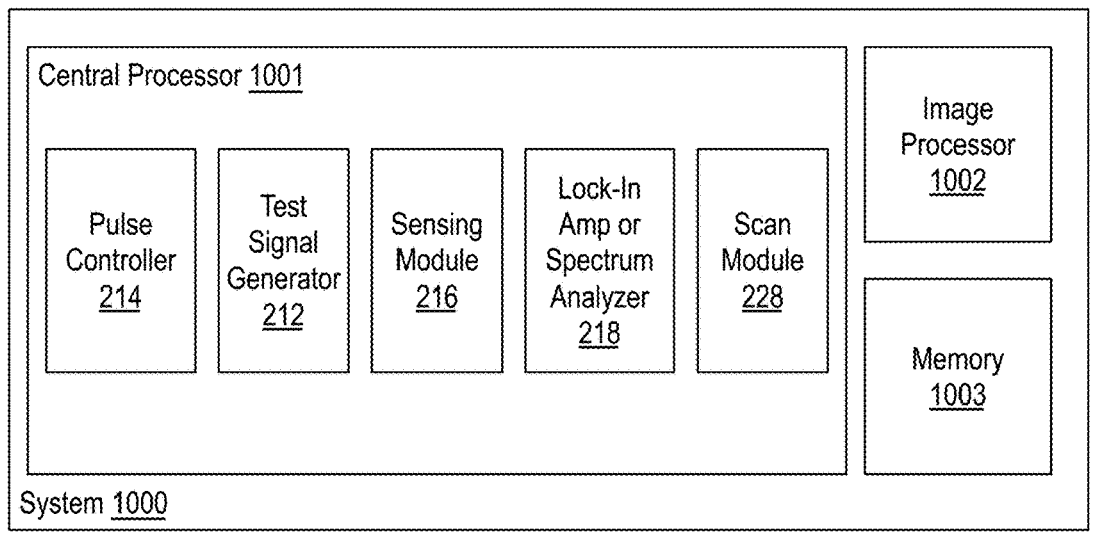
FIG. 10 is an illustrative diagram of an example system for performing pulsed electron-beam prober testing.

FIG. 10 is an illustrative diagram of an example system 1000 for performing pulsed electron-beam prober testing, arranged in accordance with at least some implementations of the present disclosure. As shown in FIG. 10, system 1000 may include pulse control module 214, test signal generator 212, sensing module 216, lock-in amplifier or spectrum analyzer 218, and scan module 228. System 100 may also include other components discussed herein. System 1000 may further include any other processor circuitry to provide control functions for operations discussed herein. As shown, system 1000 may further include an image processor 1002, and a memory 1003

As shown, in some examples, one or more or portions of pulse control module 214, test signal generator 212, sensing module 216, lock-in amplifier or spectrum analyzer 218, and scan module 228 are implemented via central processor 1001. However, pulse control module 214, test signal generator 212, sensing module 216, lock-in amplifier or spectrum analyzer 218, and scan module 228 may be implemented, at least in part, by any components of system 1000. In some examples, one or more or portions of pulse control module 214, test signal generator 212, sensing module 216, lock-in amplifier or spectrum analyzer 218, and scan module 228 are implemented in hardware as a system-on-a-chip (SoC). In some examples, one or more or portions of pulse control module 214, test signal generator 212, sensing module 216, lock-in amplifier or spectrum analyzer 218, and scan module 228 are implemented in hardware via a FPGA.

Image processor 1002 may include any number and type of image or graphics processing units that may provide the operations as discussed herein. Such operations may be implemented via software or hardware or a combination thereof. For example, image processor 1002 may include circuitry dedicated to manipulate and/or analyze images obtained from memory 1003. Central processor 1001 may include any number and type of processing units or modules that may provide control and other high level functions for system 1000 and/or provide any operations as discussed herein. Memory 1003 may be any type of memory such as volatile memory (e.g., Static Random Access Memory (SRAM), Dynamic Random Access Memory (DRAM), etc.) or non-volatile memory (e.g., flash memory, etc.), and so forth. In a non-limiting example, memory 1003 may be implemented by cache memory.

Returning to discussion of FIG. 9, process 900 begins at operation 901, where a die is received for test. The die may be received as part of a wafer or segmented from a wafer. Furthermore, the die may be tested in-line (i.e., during fabrication) or after fabrication. As discussed, the die may be tested from the front-side of the die, the back-side of the die, or both. Processing continues at operation 902, where a probe is coupled to the first die. For example, the die for test may positioned for testing by stage 101 and probe 109 may be coupled to the die.

Processing continues at operation 903, where an electrical test signal is provided to one or more integrated circuit structures of the first die under test. As used herein, the term integrated circuit structure indicates any structure under test, which may be integrated with respect to the test being performed. The electrical test signal may be modulated at any frequency discussed herein such that the frequency is greater than a frequency capable of being detected by a detector being deployed.

Processing continues at operation 904, where a pulsed e-beam is emitted onto the first die under test contemporaneously with the electrical test signal applied at operation 903. The pulsed e-beam has one of a frequency delta relative to the electrical test signal applied at operation 903 or a number of packets of beam pulses at the frequency of the electrical test signal such that the frequency delta or the packets of beam pulses establishes a modulation of a received imaging signal (discussed with respect to operation 905) at a second frequency less than the first frequency and distinguishable by the detector. In some embodiments, the pulsed beam is a pulsed electron beam and the detector is a phosphor screen detector.

In some embodiments, the pulsed beam deploys the number of packets of beam pulses at the first frequency within each packet such that temporally adjacent ones of the packets are separated by durations of fewer or no pulses. In some embodiments, the packets of beam pulses of the pulsed beam are at a second frequency lower than the first frequency and detectable by the detector being deployed. In some embodiments, the modulated electrical test signal includes alternating on and off signal durations and wherein the beam pulses of each packet are offset from the on and off signal durations by a time offset less than individual ones of the on or off signal durations. In some embodiments, the time offset is less than individual ones of the off signal durations and each of the pulses within the first packet of pulses aligns with an individual one of the off signal durations.

In some embodiments, the pulsed beam used at operation 904 has a third frequency having the frequency delta relative to the first frequency. In some embodiments, the frequency delta is substantially equal to a second frequency lower than the first frequency and detectable by the detector being deployed. In some embodiments, process 900 further includes determining the third frequency as a sum of the first frequency and the second frequency.

Processing continues at operation 905, where an imaging signal (e.g., an e-beam signal corresponding to the e-beam) is detected. As discussed, the received or detected imaging signal is modulated such that an expected signal of a functioning device is at a frequency (i.e., the second frequency) that is detectable by the deployed detector. In some embodiments, the pulsed beam is a pulsed electron beam and process 900 further includes evaluating the imaging signal or an electrical signal corresponding thereto using phase lock detection by providing the imaging signal or the electrical signal to a lock-in amplifier or spectrum analyzer tuned to the second frequency.

Processing continues at operation 906, where output mapping data inclusive of the imaging signal detected at operation 905 are generated. For example, the detected imaging signal (e.g., of secondary electrons) may provide an intensity value (or similar value) for a current image point or position. Such processing is then repeated for positions along a scanning (to provide any suitable mapping resolution) to generate an intensity value for each position of a stroboscopic electron-beam signal image mapping (SESIM) image. The resultant image data provides output mapping data and may be in any suitable file format.

Processing continues at operation 907, where the output mapping generated at operation 907 is compared to an expected mapping to identify failures. For example, the expected mapping may correspond to a known device layout that includes locations of devices being tested. The output mapping generated at operation 907 is the compared to the known device layout and any known device location that does not have a corresponding signal detected in the output mapping is flagged as a failing device.

Figure 11:
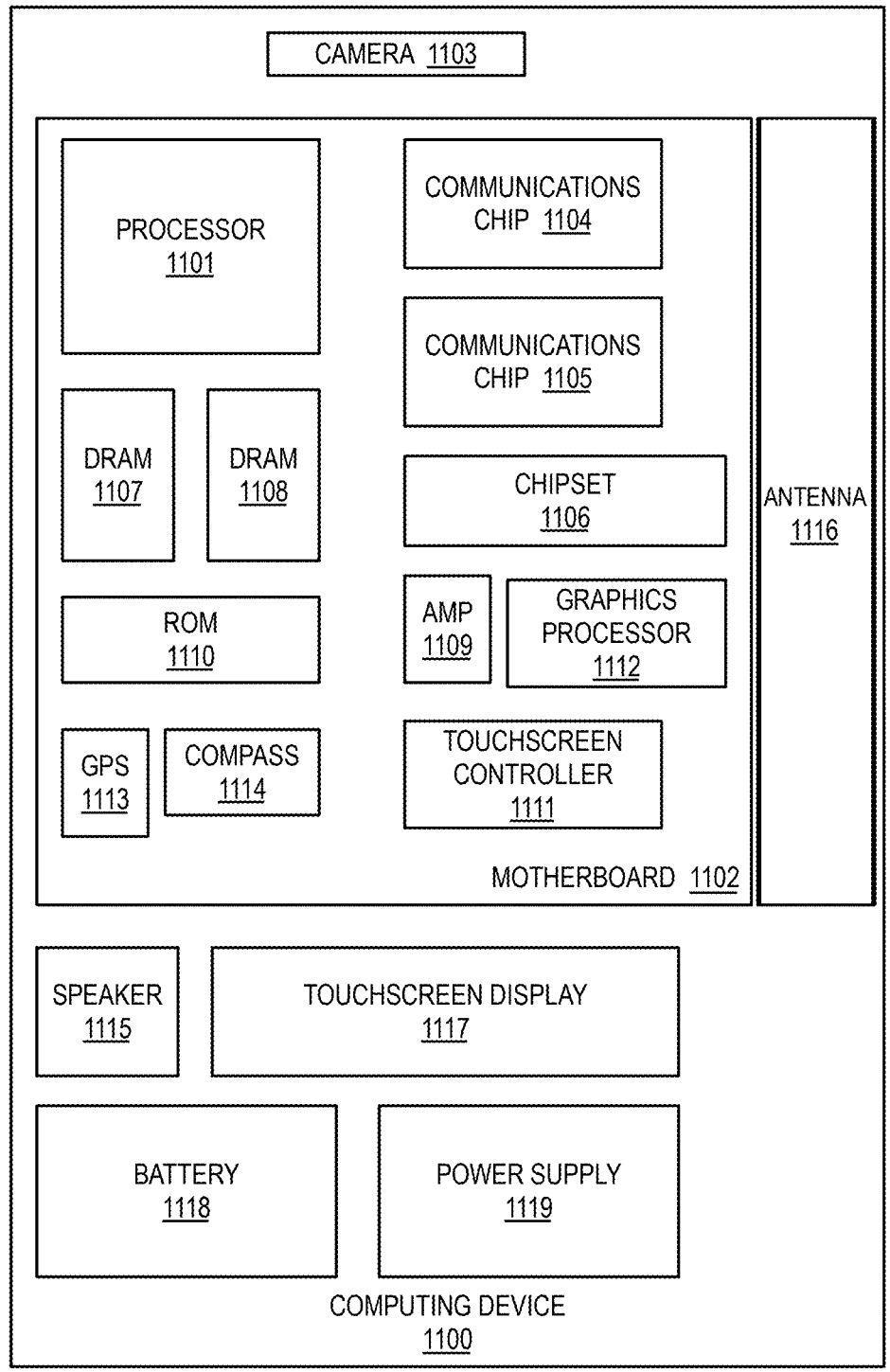
FIG. 11 is a functional block diagram of a computing device, all arranged in accordance with at least some implementations of the present disclosure.

FIG. 11 is a functional block diagram of a computing device 1100, arranged in accordance with at least some implementations of the present disclosure. Computing device 1100 includes a motherboard 1102 hosting a number of components, such as but not limited to a processor 1101 (e.g., an applications processor) and one or more communications chips 1104, 1105. Processor 1101 may be physically and/or electrically coupled to motherboard 1102. In some examples, processor 1101 includes an integrated circuit die packaged within processor 1101. In general, the term "processor" may refer to any device or portion of a device that processes electronic data from registers and/or memory to transform that electronic data into other electronic data that may be stored in registers and/or memory. Any operation discussed herein may be performed or controlled under instructions run by computing device 1100.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics processor 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, a battery 1118, and a power supply 1119, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1104, 1105 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1104, 1105 may implement any of a number of wireless standards or protocols, including but not limited to those described elsewhere herein. As discussed, computing device 1100 may include a plurality of communication chips 1104, 1105. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1119 may convert a source power from a source voltage to one or more voltages employed by other devices of computing device 1100. In some embodiments, power supply 1119 converts an AC power to DC power. In some embodiments, power supply 1119 converts an DC power to DC power at one or more different (lower) voltages. In some embodiments, multiple power supplies are staged to convert from AC to DC and then from DC at a higher voltage to DC at a lower voltage as specified by components of computing device 1100.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, a method comprises providing a modulated electrical test signal to an integrated circuit structure of a die, wherein the modulated electrical test signal has a first frequency, In one or more second embodiments, further to the first embodiments, the pulsed beam comprises the number of packets of beam pulses at the first frequency within each packet, wherein temporally adjacent ones of the packets are separated by durations of fewer or no pulses.

In one or more third embodiments, further to the first or second embodiments, the packets of beam pulses of the pulsed beam are at the second frequency.

In one or more fourth embodiments, further to the first through third embodiments, the modulated electrical test signal comprises alternating on and off signal durations, and wherein the beam pulses of each packet are offset from the on and off signal durations by a time offset less than individual ones of the on or off signal durations.

In one or more fifth embodiments, further to the first through fourth embodiments, the time offset is less than individual ones of the off signal durations, and wherein each of the pulses within the first packet of pulses aligns with an individual one of the off signal durations.

In one or more sixth embodiments, further to the first through fifth embodiments, the pulsed beam comprises a third frequency having the frequency delta relative to the first frequency.

In one or more seventh embodiments, further to the first through sixth embodiments, the pulsed beam comprises a third frequency having the frequency delta relative to the first frequency.

In one or more eighth embodiments, further to the first through seventh embodiments, the method further comprises determining the third frequency as a sum of the first frequency and the second frequency.

In one or more ninth embodiments, further to the first through eighth embodiments, the pulsed beam comprises a pulsed electron beam, and the method further comprises evaluating the imaging signal or an electrical signal corresponding thereto using phase lock detection by providing the imaging signal or the electrical signal to a lock-in amplifier or spectrum analyzer tuned to the second frequency.

In one or more tenth embodiments, further to the first through ninth embodiments, the pulsed beam comprises a pulsed electron beam and the detector comprises a phosphor screen detector.

In one or more eleventh embodiments, further to the first through tenth embodiments, the method further comprises comparing an output mapping image generated using the imaging signal to a predefined output mapping to detect a failure of the integrated circuit structure.

In one or more twelfth embodiments, a system comprises a probe to provide a modulated electrical test signal to an integrated circuit structure of a die, wherein the modulated electrical test signal has a first frequency, an electron-beam (e-beam) column to apply a pulsed electron beam to the integrated circuit structure, wherein the pulsed beam comprises one of a frequency delta relative to the first frequency or a number of packets of beam pulses at the first frequency within each packet, a detector to detect an imaging signal from the integrated circuit structure at a detector, wherein the frequency delta or the packets of beam pulses establishes a modulation of the imaging signal at a second frequency less than the first frequency and distinguishable by the detector, and a lock-in amplifier or spectrum analyzer tuned to the secondary frequency.

In one or more thirteenth embodiments, further to the twelfth embodiments, the pulsed beam comprises the number of packets of beam pulses at the first frequency within each packet, and temporally adjacent ones of the packets are separated by durations of fewer or no pulses.

In one or more fourteenth embodiments, further to the twelfth or thirteenth embodiments, the packets of beam pulses of the pulsed beam are at the second frequency.

In one or more fifteenth embodiments, further to the twelfth through fourteenth embodiments, the pulsed electron beam comprises a third frequency having the frequency delta relative to the first frequency.

In one or more sixteenth embodiments, further to the twelfth through fifteenth embodiments, the frequency delta is substantially equal to the second frequency.

In one or more seventeenth embodiments, further to the twelfth through sixteenth embodiments, the detector comprises a phosphor screen detector.

In one or more eighteenth embodiments, a system comprises a memory to store a data structure corresponding to a modulated electrical test signal, and processor circuitry coupled to the memory, the processor circuitry to control a probe to provide the modulated electrical test signal to an integrated circuit structure of a die, wherein the modulated electrical test signal has a first frequency, control a beam column to apply a pulsed beam to the integrated circuit structure, wherein the pulsed beam comprises one of a frequency delta relative to the first frequency or a number of packets of beam pulses at the first frequency within each packet, receive an imaging signal from the integrated circuit structure at a detector, wherein the frequency delta or the packets of beam pulses establishes a modulation of the imaging signal at a second frequency less than the first frequency, and generate an image based on the imaging signal.

In one or more nineteenth embodiments, further to the eighteenth embodiments, the pulsed beam comprises the number of packets of beam pulses at the first frequency within each packet, wherein temporally adjacent ones of the packets are separated by durations of fewer or no pulses.

In one or more twentieth embodiments, further to the eighteenth or nineteenth embodiments, the packets of beam pulses of the pulsed beam are at the second frequency.

In one or more twenty-first embodiments, further to the eighteenth through twentieth embodiments, the pulsed beam comprises a third frequency having the frequency delta relative to the first frequency.

In one or more twenty-second embodiments, further to the eighteenth through twenty-first embodiments, the frequency delta is substantially equal to the second frequency.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method, comprising:
providing a modulated electrical test signal to an integrated circuit structure of a die, wherein the modulated electrical test signal has a first frequency;
applying a pulsed beam to the integrated circuit structure, wherein the pulsed beam comprises one of a frequency delta relative to the first frequency or a number of packets of beam pulses at the first frequency within each packet; and
detecting an imaging signal from the integrated circuit structure at a detector, wherein the frequency delta or the packets of beam pulses establishes a modulation of the imaging signal at a second frequency less than the first frequency and distinguishable by the detector.

2. The method of claim 1, wherein the pulsed beam comprises the number of packets of beam pulses at the first frequency within each packet, wherein temporally adjacent ones of the packets are separated by durations of fewer or no pulses.

3. The method of claim 2, wherein the packets of beam pulses of the pulsed beam are at the second frequency.

4. The method of claim 2, wherein the modulated electrical test signal comprises alternating on and off signal durations, and wherein the beam pulses of each packet are offset from the on and off signal durations by a time offset less than individual ones of the on or off signal durations.

5. The method of claim 4, wherein the time offset is less than individual ones of the off signal durations, and wherein each of the beam pulses within the packet of beam pulses aligns with an individual one of the off signal durations.

6. The method of claim 1, wherein the pulsed beam comprises a third frequency having the frequency delta relative to the first frequency.

7. The method of claim 6, wherein the pulsed beam comprises a third frequency having the frequency delta relative to the first frequency.

8. The method of claim 7, further comprising:
determining the third frequency as a sum of the first frequency and the second frequency.

9. The method of claim 1, wherein the pulsed beam comprises a pulsed electron beam, the method further comprising:
evaluating the imaging signal or an electrical signal corresponding thereto using phase lock detection by providing the imaging signal or the electrical signal to a lock-in amplifier or spectrum analyzer tuned to the second frequency.

10. The method of claim 1, wherein the pulsed beam comprises a pulsed electron beam and the detector comprises a phosphor screen detector.

11. The method of claim 1, further comprising:

comparing an output mapping image generated using the imaging signal to a predefined output mapping to detect a failure of the integrated circuit structure.

12. A system, comprising:
a probe to provide a modulated electrical test signal to an integrated circuit structure of a die, wherein the modulated electrical test signal has a first frequency;
an electron-beam (e-beam) column to apply a pulsed electron beam to the integrated circuit structure, wherein the pulsed beam comprises one of a frequency delta relative to the first frequency or a number of packets of beam pulses at the first frequency within each packet;
a detector to detect an imaging signal from the integrated circuit structure at a detector, wherein the frequency delta or the packets of beam pulses establishes a modulation of the imaging signal at a second frequency less than the first frequency and distinguishable by the detector; and
a lock-in amplifier or spectrum analyzer tuned to the second frequency.

13. The system of claim 12, wherein the pulsed beam comprises the number of packets of beam pulses at the first frequency within each packet, wherein temporally adjacent ones of the packets are separated by durations of fewer or no pulses.

14. The system of claim 13, wherein the packets of beam pulses of the pulsed beam are at the second frequency.

15. The system of claim 12, wherein the pulsed electron beam comprises a third frequency having the frequency delta relative to the first frequency.

16. The system of claim 15, wherein the frequency delta is substantially equal to the second frequency.

17. The system of claim 12, wherein the detector comprises a phosphor screen detector.

18. A system, comprising:
a memory to store a data structure corresponding to a modulated electrical test signal; and
processor circuitry coupled to the memory, the processor circuitry to:
control a probe to provide the modulated electrical test signal to an integrated circuit structure of a die, wherein the modulated electrical test signal has a first frequency;
control a beam column to apply a pulsed beam to the integrated circuit structure, wherein the pulsed beam comprises one of a frequency delta relative to the first frequency or a number of packets of beam pulses at the first frequency within each packet;
receive an imaging signal from the integrated circuit structure at a detector, wherein the frequency delta or the packets of beam pulses establishes a modulation of the imaging signal at a second frequency less than the first frequency; and
generate an image based on the imaging signal.

19. The system of claim 18, wherein the pulsed beam comprises the number of packets of beam pulses at the first frequency within each packet, wherein temporally adjacent ones of the packets are separated by durations of fewer or no pulses.

20. The system of claim 19, wherein the packets of beam pulses of the pulsed beam are at the second frequency.

21. The system of claim 18, wherein the pulsed beam comprises a third frequency having the frequency delta relative to the first frequency.

22. The system of claim 21, wherein the frequency delta is substantially equal to the second frequency.

* * * * *